United States Patent
Jung et al.

(10) Patent No.: US 7,116,127 B2
(45) Date of Patent: Oct. 3, 2006

(54) CIRCUIT WITH FUSE AND SEMICONDUCTOR DEVICE HAVING THE SAME CIRCUIT

(75) Inventors: Young-Hee Jung, Gyeonggi-do (KR); Sang-Seok Kang, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 37 days.

(21) Appl. No.: 10/640,736

(22) Filed: Aug. 13, 2003

(65) Prior Publication Data

US 2004/0046601 A1    Mar. 11, 2004

(30) Foreign Application Priority Data

Sep. 10, 2002    (KR) .................. 10-2002-0054738

(51) Int. Cl.
*H03K 17/16*    (2006.01)

(52) U.S. Cl. .................. 326/27; 326/26; 326/82; 326/83

(58) Field of Classification Search .................. 326/37, 326/47, 49–50, 26–28, 82–83; 327/108–112
See application file for complete search history.

(56) References Cited

U.S. PATENT DOCUMENTS

| | | | | |
|---|---|---|---|---|
| 6,025,738 A | * | 2/2000 | Masleid | 326/83 |
| 6,501,702 B1 | * | 12/2002 | Takagiwa et al. | 365/230.06 |
| 6,529,050 B1 | * | 3/2003 | Kuo et al. | 327/112 |
| 6,535,020 B1 | * | 3/2003 | Yin | 326/83 |

* cited by examiner

*Primary Examiner*—Anh Q. Tran
(74) *Attorney, Agent, or Firm*—Marger Johnson & McCollom, P.C.

(57) ABSTRACT

A circuit with fuses and a semiconductor device having the same circuit include a first switch connected to a power supply voltage or a signal input terminal and turned on in response to a first pulse signal, a second switch connected to a ground voltage and turned on in response to a second pulse signal, a fuse connected between the first switch and the second switch, and a signal generating circuit for producing the first and second pulse signals. The first pulse signal turns off the first switch before the second pulse signal turns on the second switch and the first pulse signal turns on the first switch after the second pulse signal turns off the second switch.

9 Claims, 8 Drawing Sheets

CIRCUIT WITH FUSE AND SEMICONDUCTOR DEVICE HAVING THE SAME CIRCUIT

CROSS REFERENCE TO RELATED APPLICATIONS

This application claims priority from Korean Patent Application No. 2002-54738, filed on Sep. 10, 2002, the contents of which are hereby incorporated by reference in their entirety for all purposes.

BACKGROUND OF INVENTION

1. Technical Field of the Invention

This disclosure relates to a circuit with fuses and a semiconductor device having the same circuit, and more particularly to a circuit with make link fuses or break link fuses and a semiconductor device including the same circuit.

2. Description of the Related Art

Generally, fuses are incorporated into a semiconductor device to allow circuits in the semiconductor devices to be selectively repaired or programmed after the semiconductor devices are fabricated. Such fuses are classified as "break link" fuses or "make link" fuses, depending on their function.

Typically, a break link fuse is fabricated by forming a conductive strip line such as polysilicon strip line, and the conductive strip line is split into two pieces by being cut out by a laser beam when the break link fuse is programmed after fabrication. On the other hand, the make link fuse includes two conductive strip lines which are stacked in a vertical direction and insulated from each other by an insulation layer that is interposed between the two conductive strips lines before the fuse is programmed. The two conductive lines are electrically connected through the interposing insulating layer after the make link fuse is programmed after fabrication.

That is, the break link fuse is in an electrically conductive status just when it is fabricated and programming of the break line fuse is accomplished by cutting the electrical connection across the break link fuse, but the make link fuse is not in an electrically conductive status when it is fabricated and programming of the make link fuse is accomplished by electrically connecting two electrically insulated conductive lines to each other.

The break link fuse is disadvantageous in that leakage current flows if the break link fuse is not completely cut off when the break line fuse is programmed.

The make link fuse is disadvantageous in that electrical conduction between the two conductive lines is easily apt to be cut off by even a small amount of current due to electro-migration since the two conductive lines are barely connected when the make link fuse is programmed. Accordingly, the connection between the two conductive lines is not cut off only if no current flows when the two conductive lines of the make link fuse are connected.

A conventional circuit with fuses is problematic because a power supply voltage and a ground voltage are usually applied to both ends of the respective break link fuses at an enable of the circuit with fuses, so leakage current flows through the fuses before the break link fuse is completely cut off. Furthermore, in the case of make link fuses, connected make link fuses may be cut off due to such leakage current.

Figure 1:
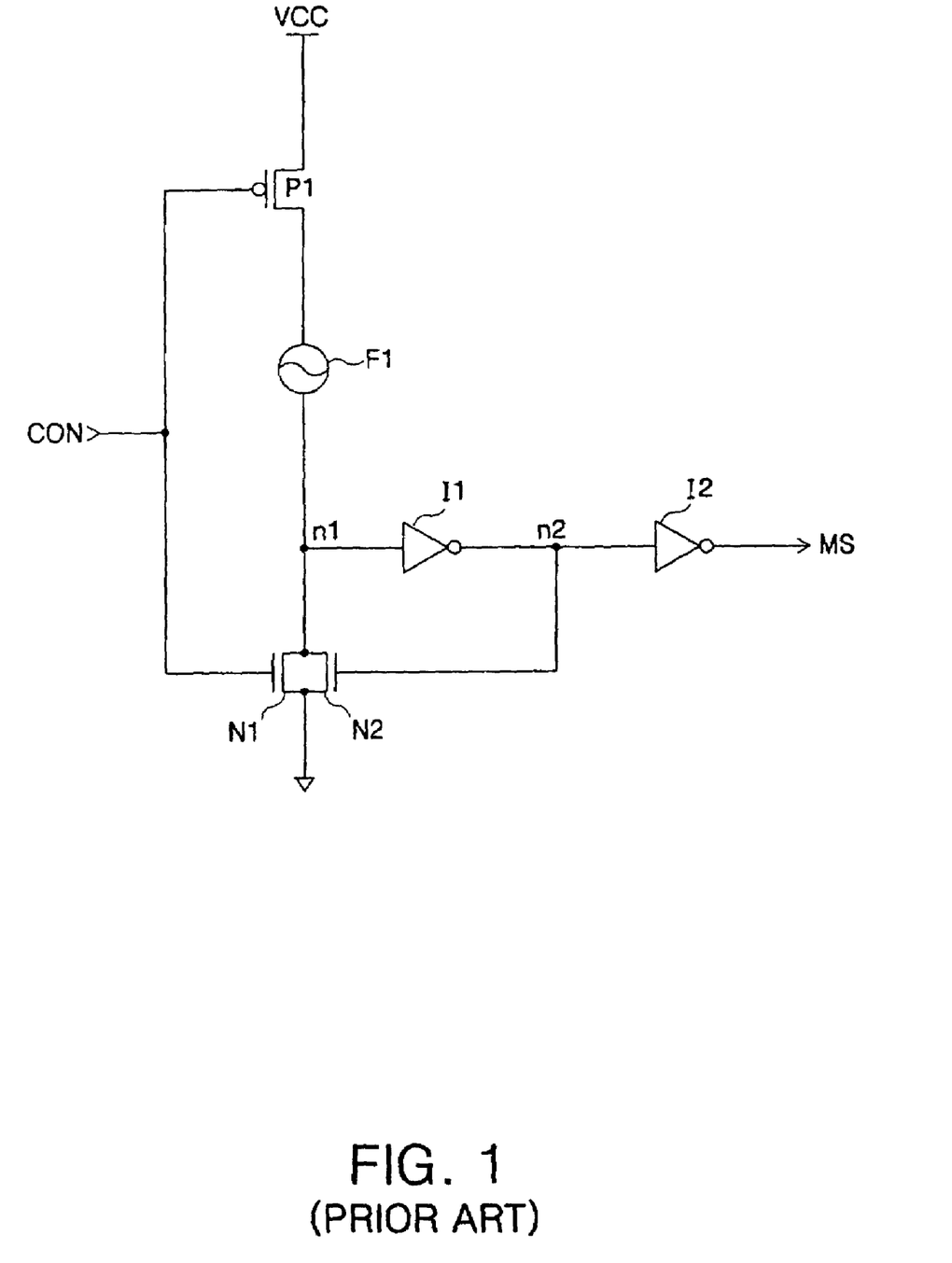
FIG. 1 is a circuit diagram of a circuit with fuses in accordance with an example of the conventional art.

FIG. 1 illustrates a circuit with fuses in accordance with an example of the conventional art. Referring to FIG. 1, a circuit with fuses in accordance with the conventional art includes a PMOS transistor P1, NMOS transistors N1 and N2, a fuse F1, and inverters I1 and I2.

The operation of the circuit shown in FIG. 1 is described below.

First, a control signal CON is generated upon detection of power-up of a system. The control signal CON may be a pulse signal generated internally or externally, or the control signal CON may be a signal having a logic "low" level at an initial stage that transitions to a logic "high" level upon detection of power-up, maintaining the logic "high" level ever after.

Assuming that the fuse F1 is a break link fuse, the fuse F1 is cut off, and the control signal CON is the pulse signal, if the control signal CON transitions from a logic "low" level to a logic "high" level, the PMOS transistor P1 is turned off and the NMOS transistor N1 is turned on, so that a node n1 becomes a ground voltage. The inverters I1 and I2 buffer a signal of the node n1 and generate a signal MS at a ground voltage level. The NMOS transistor N2 is turned on in response to a signal of a node N2 and brings the node 1 to a ground voltage level.

After that, if the control signal CON transitions from logic "high" level to logic "low" level, the PMOS transistor P1 is turned on and the NMOS transistor N1 is turned off. At this time, since the break link fuse F1 is cut off, the circuit outputs a signal that is latched by the inverter I1 and the NMOS transistor N2. That is, the signal MS is generated at a ground voltage level.

At this time, if the break link fuse F1 is not completely cut off, when the control signal CON transitions from logic "low" level to logic "high" level or vice versa, the PMOS transistor P1 and the NMOS transistor N1 are turned on at the same time. As a result, leakage current may flow through the break link fuse F1.

Assuming that the fuse F1 is a make link fuse, the conductive lines in the fuse F1 are electrically connected (programmed), and the control signal CON is a pulse signal, if the control signal CON transitions from a logic "low" level to a logic "high" level, the node n1 becomes a ground voltage, and the inverters I1 and I2 buffer a signal of the node n1 and generate the signal MS at a ground voltage level in the same manner as the break link fuse.

After that, if the control signal CON transitions from a logic "high" level to a logic "low" level, the PMOS transistor P1 is turned on and the NMOS transistor N1 is turned off. At this time, since the make link fuse F1 is electrically connected, the node n1 becomes a power supply voltage level. The inverters I1 and I2 buffer the signal of the node n1 and generate the signal MS of a power supply voltage level. The NMOS transistor N2 is turned off in response to the node n2 of a ground voltage level.

However, when the control signal CON transitions from a logic "low" level to a logic "high" level or vice versa, the PMOS transistor P1 and the NMOS transistor N1 are turned on at the same time. This causes current flow through the make link fuse F1, such that the make link fuse F1 may be electrically cut off.

Figure 2:
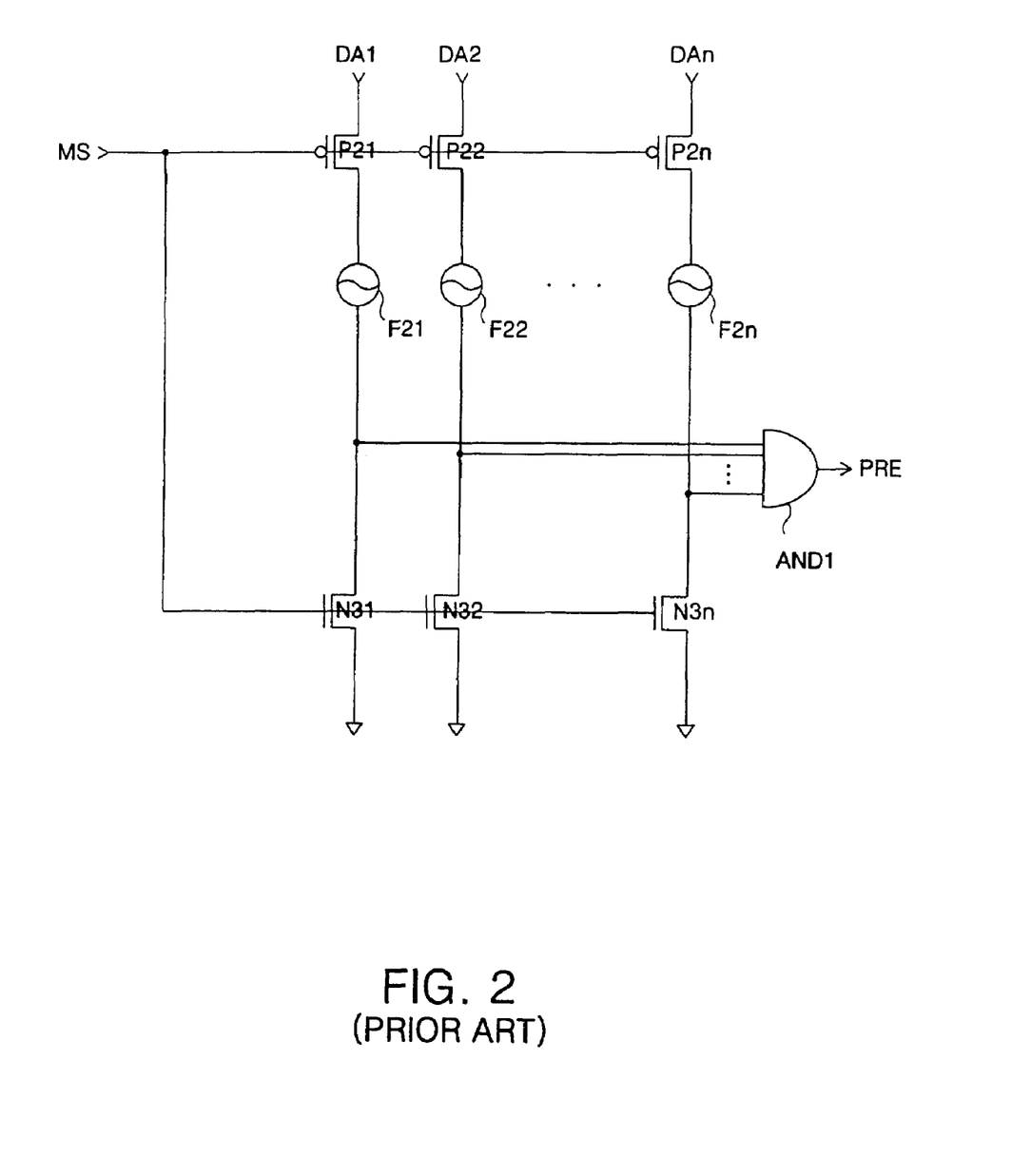
FIG. 2 is a circuit diagram of a redundancy address decoding circuit having fuses therein in accordance with an example of the conventional art.

FIG. 2 illustrates a conventional redundancy address decoding circuit that includes fuses. As shown in FIG. 2, a conventional redundancy address decoding circuit includes PMOS transistors P21, P22, . . . , P2n, NMOS transistors N31, N32, . . . ,N3n, fuses F21, F22, . . . , F2n, and an AND gate AND1.

The operation of the circuit shown in FIG. 2 is described below.

If a memory cell accessed using a decoding address DA1, DA2, . . . , DAn with logic values "1, . . . ,1,0", respectively, fails and the memory cell needs to be repaired, a logic "high" level of the signal MS is generated from the circuit shown in FIG. 1. Fuses F21–F2n are programmed in accordance with the decoding address "1, . . . ,1,0", and a redundancy address decoding signal PRE is generated.

If the fuses F21–F2n are break link fuses, only the fuse F2n is cut off to program the decoding address "1, . . . ,1,0". If the fuses F21–F2n are make link fuses, the fuses F21–F21(n−1) are connected to program the decoding address "1, . . . ,1,0". Then, when "1, . . . ,1,0" of the decoding address DA1, DA2, . . . , DAn is input, a redundancy enable signal PRE of logic "high" level is generated.

However, in the circuit shown in FIG. 2, if the break link fuse F2n is not completely cut off, the PMOS transistor P2n and the NMOS transistor N3n are turned on at the same time when the signal MS transitions from logic "low" level to logic "high" level, or transitions from logic "high" level to logic "low" level, so that current flows through the break link fuse F2n.

Furthermore, in the case where the fuses F21–F2n are make link fuses, when the redundancy enable signal MS transitions from logic "low" level to logic "high" level or transitions from logic "high" level to logic "low" level, all the PMOS transistors P21–P2(n−1) and all the NMOS transistors N31–N3(n−1) are turned on at the same time and current flows through the electrically connected make link fuses F21–F2(n−1), so that the electrically connected make link fuses may be cut off.

When the control signal CON transitions from logic "low" level to logic "high" level, the same leakage current problem described above occurs.

Embodiments of the invention address these and other disadvantages of the conventional art.

SUMMARY OF THE INVENTION

Embodiments of the invention provide a circuit with fuses capable of preventing leakage current from flowing through the fuses, and a semiconductor device having the same circuit.

BRIEF DESCRIPTION OF THE DRAWINGS

The above and other features and advantages of the invention will become readily apparent to those of ordinary skill in the art by describing in detail preferred embodiments thereof with reference to the attached drawings.

DETAILED DESCRIPTION OF THE INVENTION

Hereinafter, the invention will be described in detail by describing preferred embodiments of the present invention with reference to the accompanying drawings. Like reference numerals refer to like elements throughout the drawings.

Figure 3:
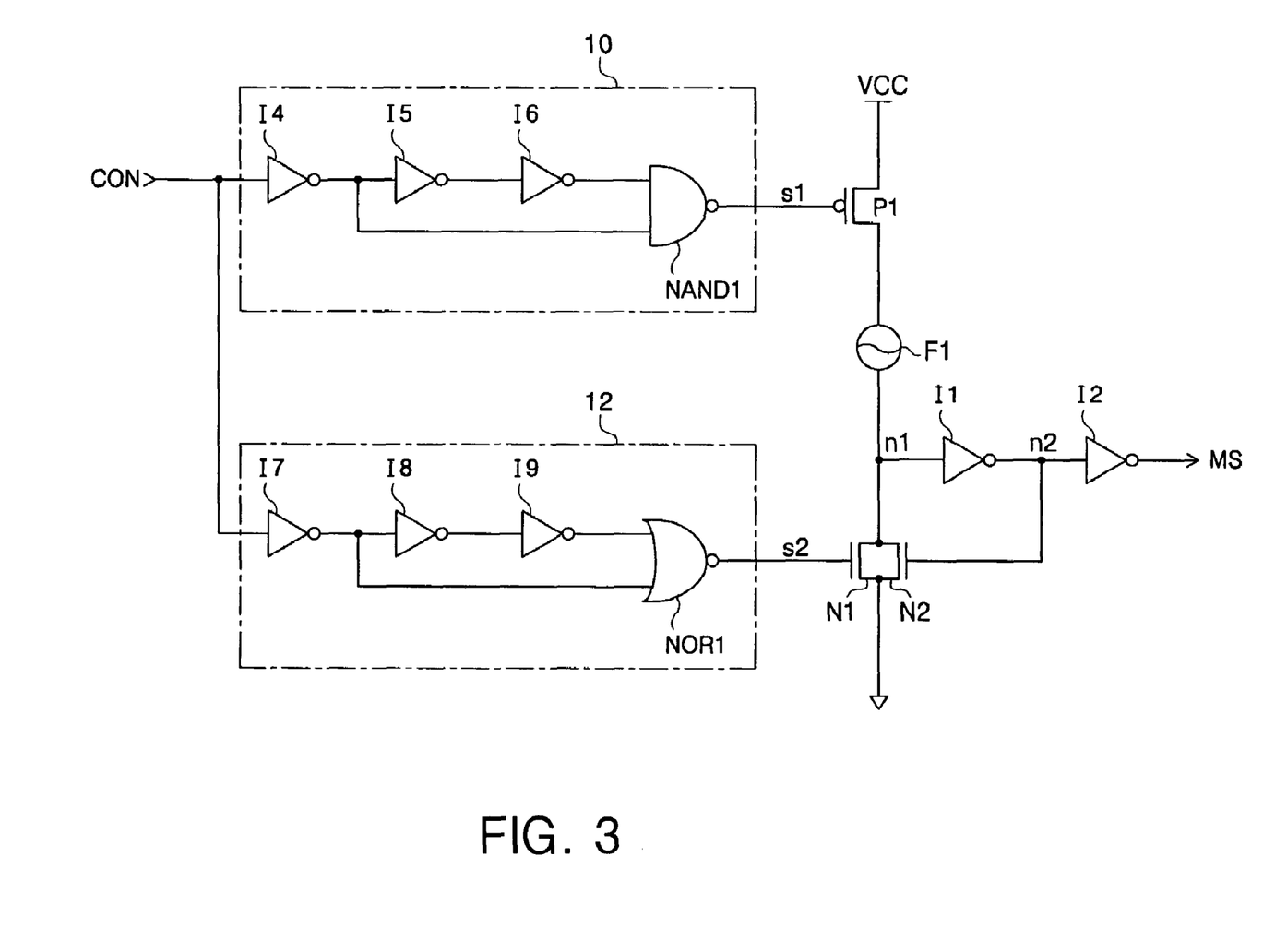
FIG. 3 illustrates a circuit using fuses in accordance with an embodiment of the invention.

FIG. 3 illustrates a circuit with fuses in accordance with an embodiment of the invention. Referring to FIG. 3, the circuit with fuses has all the elements in the circuit shown in FIG. 1 and further includes a first pulse signal generating circuit 10 and a second pulse signal generating circuit 12.

The first pulse signal generating circuit 10 includes inverters I4, I5, I6, and a NAND gate NAND1. The second pulse signal generating circuit 12 includes inverters I7, I8, I9 and a NOR gate NOR1.

The operation of the circuit shown in FIG. 3 is described below.

The first pulse signal generating circuit 10 detects a rising edge of the control signal CON and generates a pulse signal s1. The second pulse signal generating circuit 12 detects a falling edge of the control signal CON and generates a pulse signal s2.

The inverters I4, I5, I6 invert and delay the control signal CON. The NAND gate NAND1 performs a NAND operation on the output signals of the inverters I4 and I6 and generates the pulse signal s1. That is, the first pulse signal generating circuit 10 generates the pulse signal s1 at a logic "low" level when both output signals of the inverters I4 and I6 are at a logic "high" level.

The inverters I7, I8, I9 invert and delay the control signal CON. The NOR gate NOR1 performs a NOR operation on the output signals of the inverters I7 and I9 and generates the pulse signal s2. That is, the second pulse signal generating circuit 12 generates the pulse signal s2 at a logic "high" level when the output signals of the inverters I7 and I9 are at a logic "low" level.

The PMOS transistor P1 is turned on when the pulse signal s1 is at a logic "low" level and the NMOS transistor N1 is turned on when the pulse signal s2 is at a logic "high" level. The NMOS transistor N2 is turned on in response to a signal of node n2, and the inverters I1 and I2 buffer the signal of node n2 and generates the signal MS.

Figure 4:
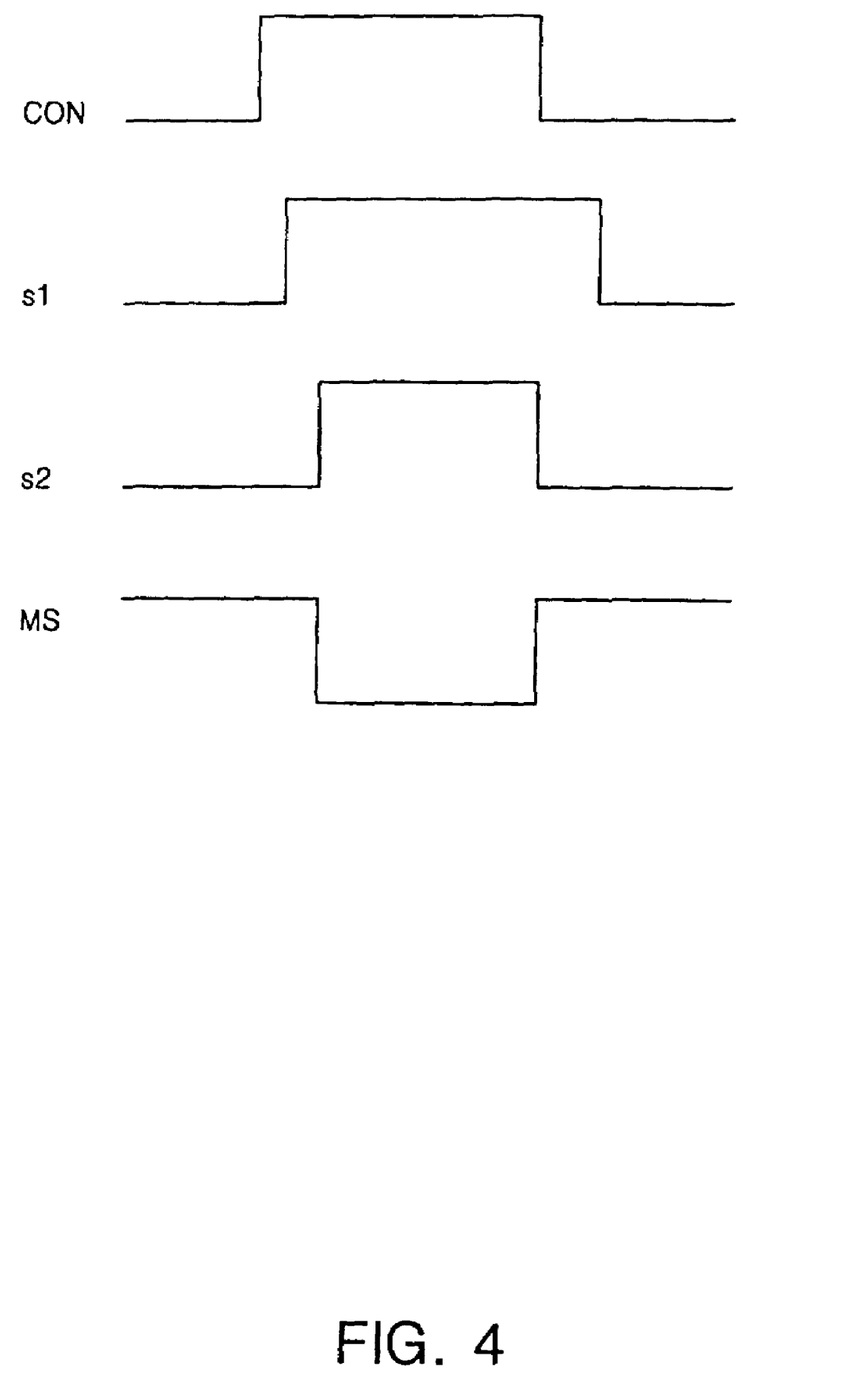
FIG. 4 is a timing diagram for explaining the operation of the circuit shown in FIG. 3.

FIG. 4 illustrates a timing diagram of the circuit shown in FIG. 3. The operation of the circuit shown in FIG. 3 is described with reference to FIG. 4.

The first pulse signal generating circuit 10 generates the pulse signal s1 having a pulse width larger than that of the control signal CON. The pulse signal s1 rises to a logic "high" level after a delay time caused by the inverter I4 when the control signal CON transitions from a logic "low" level to a logic "high" level. The pulse signal s1 falls to logic "low" level after a predetermined delay time caused by the inverters I4, I5, I6 when the control signal CON transitions from a logic "high" level to a logic "low" level. The second pulse signal generating circuit 12 generates the pulse signal s2 having a pulse width smaller than that of the control signal CON. The pulse signal s2 rises to logic "high" level with a predetermined delay time caused by the inverters I7, I8, I9 after the control signal CON transitions from a logic "low" level to a logic "high" level. The pulse signal s2 falls to a logic "low" level when the control signal CON transitions from a logic "high" level to a logic "low" level.

In the circuit of FIG. 3, that part of the circuit that includes the PMOS transistor P1, the NMOS transistors N1, N2, the fuse F1, and the inverters I1, I2 operates in the same way as the circuit shown in FIG. 1.

If the fuse F1 is a make link fuse and the fuse F1 is programmed to be electrically connected, the NMOS transistor N1 is turned on in response to the pulse signal s2 at a logic "high" level and the signal MS at a logic "low" level is generated.

In the circuit of FIG. 3, when the control signal CON transitions from a logic "low" level to a logic "high" level, the pulse signal s1 rises to a logic "high" level in advance of the pulse signal s2. When the control signal CON transitions from a logic "high" level to a logic "low" level, the pulse signal s2 falls to a logic "low" level in advance of the pulse signal s1. Accordingly, the PMOS transistor P1 and the NMOS transistor N1 are not turned on at the same time. That is, the PMOS transistor P1 is turned off prior to when the NMOS transistor is turned on. Furthermore, the PMOS transistor P1 is turned on after the NMOS transistor N1 is turned off. Accordingly, the PMOS transistor P1 and the NMOS transistor N1 are not turned on at the same time.

Consequently, if the fuse F1 is a break link fuse, the leakage current that occurs when the PMOS transistor P1 and the NMOS transistor N1 are turned on at the same time is reduced. Furthermore, if the fuse F1 is a make link fuse, an unintentional cut-off of a connected make link fuse is prevented.

Figure 5:
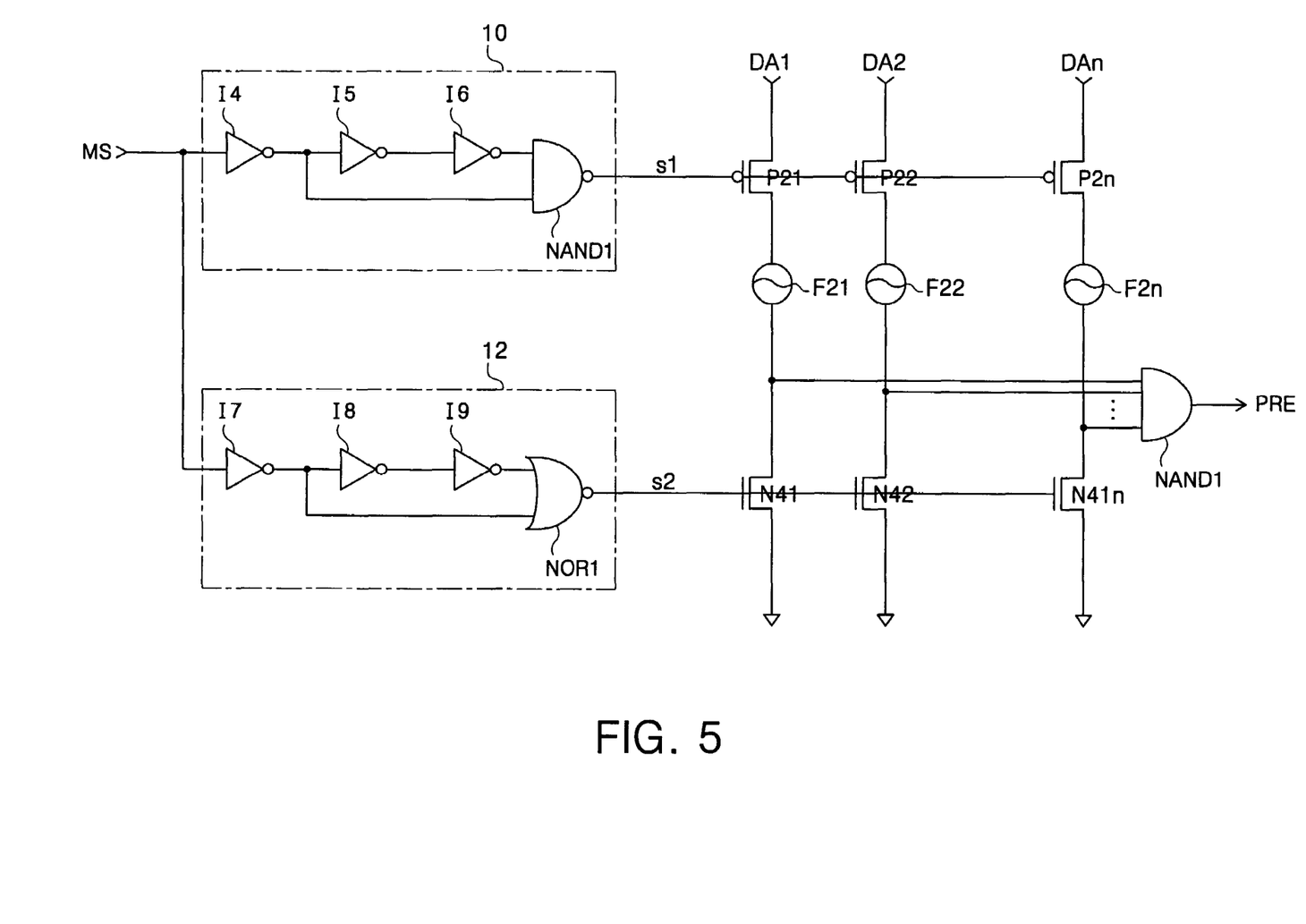
FIG. 5 is a circuit diagram of a redundancy address decoding circuit using fuses in accordance with another embodiment of the invention.

FIG. 5 illustrates a redundancy address decoding circuit in accordance with another embodiment of the invention. Referring to FIG. 5, a redundancy address decoding circuit of this embodiment includes all the circuit elements of the conventional redundancy address decoding circuit shown in FIG. 2 and further includes a first pulse signal generating circuit 10 and a second pulse signal generating circuit 12.

The operation of the circuit shown in FIG. 5 is described below.

The first pulse signal generating circuit 10 and the second pulse signal generating circuit 12 shown in FIG. 5 are the same as that of FIG. 3. Because the circuit of FIG. 5 also includes all the circuit elements of FIG. 2, the redundancy decoding operation of the circuit of FIG. 5 is similar to that of the circuit of FIG. 2. Accordingly, such redundancy decoding operations of the circuit that have already been explained with respect to FIG. 2 will not be repeated.

The operation of the circuit of FIG. 5 is different from the operation of the circuit of FIG. 2, however, because the pulse signal s1 rises to logic "high" level in advance of the pulse signal s2, when the signal MS transitions from a logic "low" level to a logic "high" level. Furthermore, the pulse signal s2 falls to a logic "low" level in advance of the pulse signal s1 when the signal MS transitions from a logic "high" level to a logic "low" level. Accordingly, the PMOS transistors P21–P2n and the NMOS transistors N31–N3n do not turn on at the same time.

As a result, in the case where the fuses F21–F2n are break link fuses, leakage current flowing through partially cut fuses is reduced in comparison with the conventional circuit because the PMOS transistors P21–P2n and the NMOS transistors N31–N3n are not turned on at the same time. Furthermore, in the case where the fuses F21–F2n are make link fuses, the fuses are not unintentionally severed.

In the circuits in FIG. 3 and FIG. 5, the control signal CON and the signal MS are preferably pulse signals, respectively.

Figure 6:
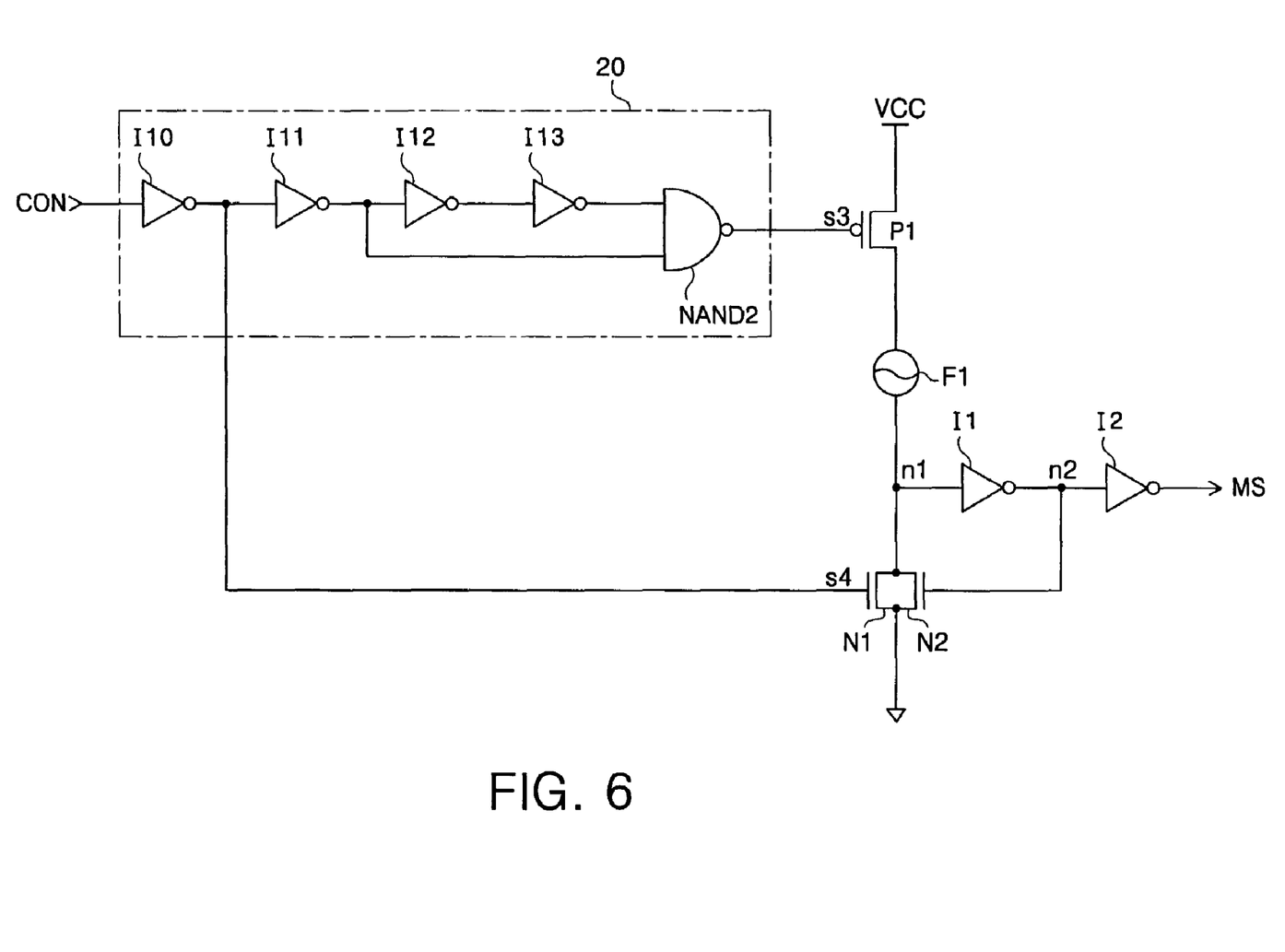
FIG. 6 is a circuit diagram of a circuit having fuses in accordance with still another embodiment of the invention.

FIG. 6 illustrates a circuit with fuses in accordance with still another embodiment of the invention. The circuit shown in FIG. 6 includes all the circuit elements of the circuit of FIG. 1 and further includes a signal generating circuit 20.

Like elements common to both FIG. 1 and FIG. 6 are designated by like reference numerals. The signal generating circuit 20 includes inverters I10, I11, I12, I13 and a NAND gate NAND2.

The operation of the circuit shown in FIG. 6 is described below.

The inverters I10, I11, I12, and I13 buffer the control signal CON and outputs the buffered control signal CON. The NAND gate NAND2 generates a signal s3 at a logic "low" level when output signals of the inverters I11 and I13 are at a logic "high" level.

The operation of the other parts of the circuit of FIG. 6, excepting the signal generating circuit 20, is similar to the operation of the circuit of FIG. 1. These other parts include the PMOS transistor P1, the NMOS transistors N1, N2, the fuse F1, and inverters I1, I2. Similar operations that have already been explained with respect to FIG. 1 will not be repeated.

Figure 7:
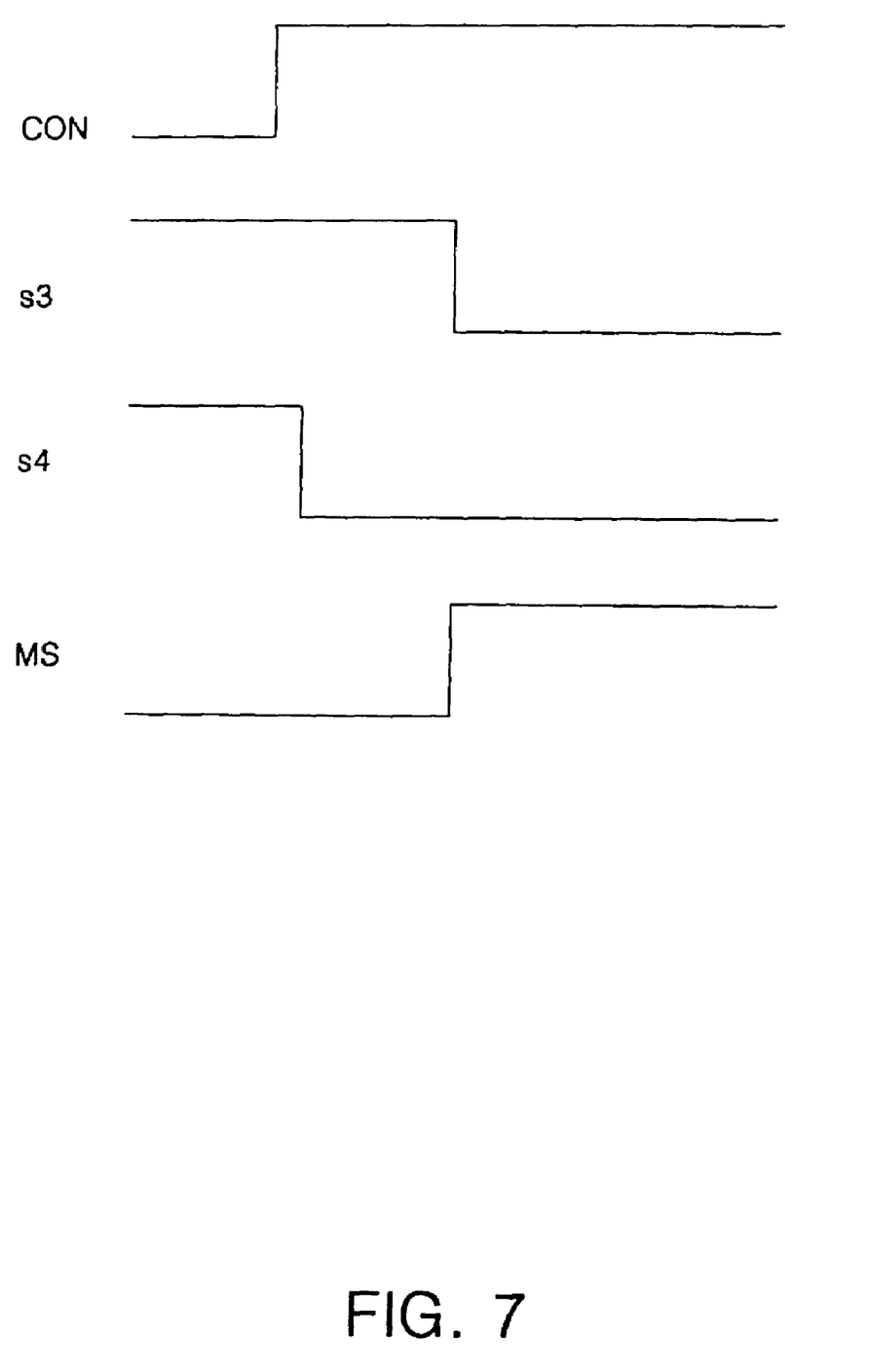
FIG. 7 is a timing diagram for explaining the operation of the circuit shown in FIG. 6.

FIG. 7 is a timing diagram illustrating some voltage levels of the circuit shown in FIG. 6. The operation of the circuit shown in FIG. 6 is described below with reference to FIG. 7.

If the control signal CON transitions from a logic "low" level to a logic "high" level, the signal generating circuit 20 delays and inverts the control signal CON and generates the signal s3. The inverter I10 delays and inverts the control signal CON and generates a signal s4. The signal s4 falls to a logic "low" level in advance of the signal s3. Consequently, the NMOS transistor N1 is turned on in advance in response to the signal s4 and the PMOS transistor P1 is turned on later in response to the signal s3.

If the fuse F1 is a make link fuse and the fuse F1 is programmed to be electrically connected, the NMOS transistor N1 is turned on in response to the signal s4 at a logic "high" level, so that the signal MS at a logic "low" level is generated. In the case where the signals s3 and s4 are at a logic "high" level and a logic "low" level, respectively, the PMOS transistor P1 and the NMOS transistor N1 are turned off, and the logic "low" level of the signal MS latched by the inverter I1 and the NMOS transistor N2 is maintained. Furthermore, if the signals s3 and s4 are all at a logic "low" level, the PMOS transistor P1 is turned on and the NMOS transistor N1 is turned off, so that the signal MS at a logic "high" level is generated.

In the circuit of FIG. 6, in the case where the control signal CON transitions from a logic "low" level to a logic "high" level, since the signal s4 falls to a logic "low" level in advance of the signal s3, the PMOS transistor P1 and the NMOS transistor N1 are not turned on at the same time.

As a result, in the case where the fuse is a break link fuse, leakage current flowing through an incompletely cut-off fuse is avoided and in the case where the fuse is a make link fuse, the connected make link fuse is not unintentionally cut off by the leakage current.

Figure 8:
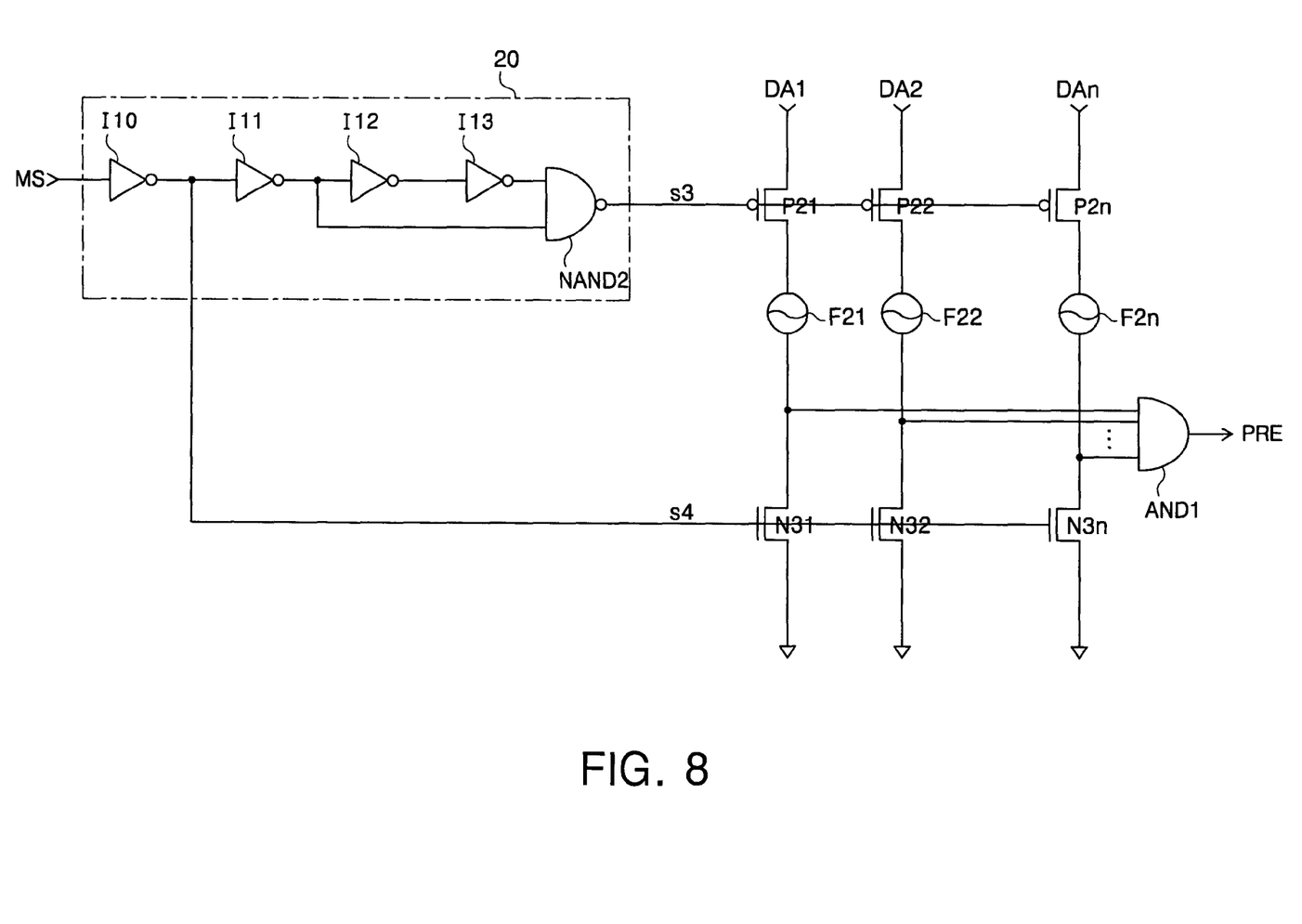
FIG. 8 is a circuit diagram of a redundancy address decoding circuit with fuses in accordance with a different embodiment of the invention.

FIG. 8 illustrates a redundancy address decoding circuit in accordance with a different embodiment of the invention. The redundancy address decoding circuit of FIG. 8 includes all of the circuit elements in FIG. 2 and further includes a signal generating circuit 20.

The operation of the redundancy address decoding circuit shown in FIG. 8 is described below.

When the signal MS transitions from a logic "low" level to a logic "high" level, the signal s4 falls to a logic "low" level in advance of the signal s3. Accordingly, the PMOS transistors P21–P2n and the NMOS transistors N31–N3n are not turned on at the same time.

In the case where the fuses F21–F2n are break link fuses, since the PMOS transistors P21–P2n and the NMOS transistors N31–N3n are not turned on at the same time, leakage current flowing through incompletely cut-off fuses F21–F2n is reduced. In the case where the fuses F21–F2n are make link fuses, fuses F21–F2n that are programmed to be electrically connected are not unintentionally cut off because the PMOS transistors P21–P2n and the NMOS transistor N31–N3n are not turned on at the same time.

The circuits shown in FIG. 6 and FIG. 8 have configurations that are adequate for the case where the control signal CON and the signal MS transition from a logic "low" level to a logic "high" level.

That is, embodiments of the invention are configured in such a manner that a power supply voltage and a ground voltage are not applied to both terminals of the fuses at the same time. With such a configuration, the leakage current may be reduced in the case of break link fuses and the unintentional cutting of fuses may be prevented in the case of make link fuses.

Embodiments of the invention will now be described in a non-limiting way.

In accordance with an embodiment of the invention, there is provided a circuit with fuses including a first switch connected to a power supply voltage (or a signal input terminal) that is turned on in response to a first pulse signal, a second switch connected to a ground voltage that is turned on in response to a second pulse signal, a fuse connected between the first switch and the second switch, and a control signal generating circuit that turns off the first switch prior to turning on the second switch by receiving a control signal, and generating the first and second pulse signals that turn off the first switch after the second switch is turned off.

Preferably, the control signal generating circuit generates the first pulse signal that transitions from a logic "high" level in advance of the second pulse signal when the control signal rises to a logic "high" level, and generates the second pulse signal that transitions from a logic "low" level in advance of the first pulse signal when the control signal falls to logic "low" level.

Preferably, the control signal generating circuit may include a first pulse signal generating circuit for generating the first pulse signal that rises to a logic "high" level in response to a rising edge of the control signal and falls to a logic "low" level with a predetermined delay time after the control signal transitions to a logic "low" level, and a second pulse signal generating circuit for generating the second pulse signal that rises to a logic "high" level in response to a rising edge of the control signal after the first signal rises to a logic "high" level, and falls to a logic "low" level in response to a falling edge of the control signal.

Preferably, the first pulse signal generating circuit may include a first inverting and delaying circuit for inverting and delaying the control signal, a first delaying circuit for delaying an output signal of the first inverting and delaying circuit, and a NAND gate for NANDing the output signal of the first inverting and delaying circuit and an output signal of the first delaying circuit.

Preferably, the second pulse signal generating circuit may include a second inverting and delaying circuit for inverting and delaying the control signal, a second delaying circuit for delaying an output signal of the second inverting and delaying circuit, and a NOR gate for NORing the output signal of the second inverting and delaying circuit and an output signal of the second delaying circuit.

In accordance with another embodiment of the invention, there is provided a circuit including a first switch connected to a power supply voltage (or a signal input terminal) that is turned on in response to a first signal, a second switch connected to a ground voltage that is turned on in response to a second signal, a fuse connected between the first switch and the second switch, and a control signal generating circuit for generating the first signal and the second signal for turning off the second switch before the first switch is turned on by receiving the control signal.

Preferably, the control signal generating circuit may include a first signal generating circuit for generating the first signal by delaying and inverting the control signal by a first delay time. The control signal generating circuit may also include a second signal generating circuit for generating the second signal by delaying and inverting the control signal by a second delay time, the second delay time being shorter than the first delay time.

Preferably, the first signal generating circuit may include a first delay circuit for delaying the control signal, a second delay circuit for delaying an output signal of the first delay circuit, and a NAND gate for NANDing output signals of the first delay circuit and the second delay circuit and generating the first signal.

In accordance with still another embodiment of the invention, there is provided a semiconductor device with fuses including a plurality of first switches connected between a power supply voltage (or a signal input terminal) and a respective one end of the corresponding fuses and turned on in response to a first pulse signal, a plurality of second switches connected between a ground voltage and a respective other end of the corresponding fuses and turned on in response to a second pulse signal, and a control signal generating circuit for generating the first and second pulse signals used for turning off the first switches before the second switches are turned on by receiving the control signal, and for turning off the first switches after the second switches are turned off.

In accordance with yet further another aspect of the present invention, there is provided a semiconductor device with fuses including a plurality of first switches connected between a power supply voltage (or a signal input terminal) and respective one ends of corresponding fuses, and turned on in response to a first signal, a plurality of second switches connected between a ground voltage and respective the other ends of the corresponding fuses, and turned on in response to a second signal, and a control signal generating circuit for generating the first and second signals for turning off the first switches before the second switches are turned on by receiving the control signal, and for turning off the first switches after second switches are turned off.

Preferred embodiments of the invention have been disclosed herein and, although specific terms are employed, they are to be interpreted in a generic and descriptive sense only and not for purpose of limitation. Accordingly, it will be understood by those of ordinary skill in the art that various changes in form and details may be made without departing from the spirit and scope of the invention as set forth in the following claims.

We claim:

1. A circuit comprising:
   a first switch connected to a first voltage and responsive to a first pulse signal;
   a second switch connected to a second voltage and responsive to a second pulse signal;
   a fuse connected between the first switch and the second switch; and a signal generating circuit responsive to a control signal and configured to generate the first and second pulse signals, wherein the first pulse signal and the second pulse signal are configured to turn off the first switch in advance of turning on of the second switch and to turn on the first switch after the second switch is turned off, wherein the signal generating circuit includes:
  a first pulse signal generating circuit configured to raise the first pulse signal to the logic "high" level in response to a rising edge of the control signal and configured to lower the first pulse signal to the logic "low" level after a predetermined delay time once the control signal transitions to the logic "low" level; and
  a second pulse signal generating circuit configured to raise the second pulse signal to the logic "high" level after the first signal is raised to the logic "high" level and configured to lower the second pulse signal to the logic "low" level in response to a falling edge of the control signal.

2. The circuit of claim 1, wherein the first switch comprises a PMOS transistor and the second switch comprises a NMOS transistor.

3. The circuit according to claim 1, wherein the first pulse signal transitions to a logic "high" level in advance of the second pulse signal when the control signal rises to the logic "high" level, and wherein the second pulse signal transitions to a logic "low" level in advance of the first pulse signal when the control signal falls to the logic "low" level.

4. The circuit according to claim 1, wherein the first pulse signal generating circuit comprises:
  a first inverting and delaying circuit configured to invert and delay the control signal;
  a first delaying circuit configured to delay an output signal of the first inverting and delaying circuit; and
  a NAND gate configured to NAND the output signal of the first inverting and delaying circuit and an output signal of the first delaying circuit.

5. The circuit according to claim 4, wherein the second pulse signal generating circuit comprises:
  a second inverting and delaying circuit configured to invert and delay the control signal;
  a second delaying circuit configured to delay an output signal of the second inverting and delaying circuit; and
  a NOR gate configured to NOR the output signal of the second inverting and delaying circuit and an output signal of the second delaying circuit.

6. A circuit with fuses comprising:
  a first switch connected to a power supply voltage and responsive to a first signal;
  a second switch connected to a ground voltage and responsive to a second signal;
  a fuse connected between the first switch and the second switch; and
  a signal generating circuit responsive to a control signal and configured to generate the first signal and the second signal for turning off the second switch before the first switch is turned on by receiving the control signal, wherein the signal generating circuit includes:
    a first delay circuit configured to delay the control signal;
    a second delay circuit configured to delay an output signal of the first delay circuit; and
    a NAND gate configured to NAND the output signal of the first delay circuit and an output signal of the second delay circuit to produce the first signal.

7. The circuit according to claim 6, wherein the first delay circuit comprises:
  a first inverter configured to receive the control signal and output the second signal; and
  a second inverter configured to receive an output of the first inverter and to generate the output signal of the first delay circuit.

8. A method comprising:
  coupling a first switch responsive to a first pulse signal between a first voltage and a fuse;
  coupling a second switch responsive to a second pulse signal between a second voltage and the fuse;
  NANDing an inverted version of the control signal and a delayed and inverted version of the control signal to generate the first pulse signal;
  transitioning the first pulse signal to a logic "high" level in advance of the second pulse signal when a control signal rises to the logic "high" level;
  NORing the inverted version of the control signal and the delayed and inverted version of the control signal to generate the second pulse signal; and
  transitioning the second pulse signal to a logic "low" level in advance of the first pulse signal when the control signal falls to the logic "low" level.

9. The method of claim 8, wherein the first switch comprises a PMOS transistor and the second switch comprises a NMOS transistor.

* * * * *